United States Patent
Gutsul et al.

(10) Patent No.: US 11,757,281 B2
(45) Date of Patent: Sep. 12, 2023

(54) ELECTROSTATIC DISCHARGE PROTECTION DEVICE WITH INTEGRATED SERIES RESISTORS

(71) Applicant: Infineon Technologies AG, Neubiberg (DE)

(72) Inventors: Anton Gutsul, Oberpframmern (DE); Joost Adriaan Willemen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/544,448

(22) Filed: Dec. 7, 2021

(65) Prior Publication Data

US 2023/0178980 A1    Jun. 8, 2023

(51) Int. Cl.
*H02H 9/04*     (2006.01)
*H01R 13/713*   (2006.01)
*H01R 13/66*    (2006.01)

(52) U.S. Cl.
CPC ............ *H02H 9/042* (2013.01); *H02H 9/045* (2013.01); *H01R 13/6666* (2013.01); *H01R 13/713* (2013.01)

(58) Field of Classification Search
CPC .......... H02H 9/042; H02H 9/04; H02H 9/043; H02H 9/046; H02H 9/00; H02H 9/045; H01R 13/6666; H01R 13/7031; H01L 27/0248; H01L 27/0246

USPC .................................................. 361/56, 91.1
See application file for complete search history.

(56) References Cited

U.S. PATENT DOCUMENTS

| | | | |
|---|---|---|---|
| 9,601,920 B2 | 3/2017 | Glas et al. | |
| 11,088,529 B2* | 8/2021 | Meline | H02H 1/04 |
| 2009/0147419 A1* | 6/2009 | Hung | H02H 9/042 |
| | | | 361/56 |
| 2015/0340359 A1* | 11/2015 | Li | H01L 27/0266 |
| | | | 361/56 |
| 2019/0155352 A1* | 5/2019 | Chung | H02J 7/0071 |
| 2021/0098987 A1 | 4/2021 | Walimbe et al. | |

FOREIGN PATENT DOCUMENTS

WO      2011037101 A1    3/2011

* cited by examiner

*Primary Examiner* — Danny Nguyen
(74) *Attorney, Agent, or Firm* — Slater Matsil, LLP

(57) ABSTRACT

An electrostatic discharge (ESD) protection device includes: a first resistor coupled between a first input terminal of the ESD protection device and a first node of the ESD protection device; a second resistor coupled between the first node and a first output terminal of the ESD protection device; and a first ESD protection component coupled between the first node and a reference voltage terminal of the ESD protection device, where the reference voltage terminal is configured to be coupled to a reference voltage.

21 Claims, 10 Drawing Sheets

ELECTROSTATIC DISCHARGE PROTECTION DEVICE WITH INTEGRATED SERIES RESISTORS

TECHNICAL FIELD

The present invention relates generally to an electrostatic (ESD) protection device. In particular, embodiments relate to an ESD protection device for a Universal Serial Bus (USB) interface.

BACKGROUND

USB 3.2 or USB4 interfaces can be extremely sensitive to ESD strikes (may also be referred to as ESD events). ESD strikes may cause damage to components such as hubs, routers, or controllers of the USB interface. Therefore, ESD protection devices are implemented for USB interfaces to prevent malfunctions or breakdowns due to ESD strikes.

Besides providing ESD protection, it may be advantageous to design the ESD protection device to provide protection against electrical overstress (EOS) events. An example of the EOS events is the so-called short-to-Vbus event, which refers to a short-circuit event between a data line and a power supply line (e.g., a Vbus line) of the USB interface. For example, in a USB Type-C receptacle, high-speed data pins are located right next to power supply pins. A damaged USB Type-C cable or misuse by the user may cause a short-to-Vbus event. If left unaddressed, the short-to-Vbus event may damage the USB interface.

Integration of circuits for protection against ESD strikes and EOS events (e.g., short-to-Vbus events) in an electronic device having a USB interface may increase the part count, cost, and space requirement for the electronic device, which may be cost and size sensitive. There is a need in the art for ESD protection devices that provide protection against ESD strikes and EOS events with minimal impact on the cost and size of the electronic device having the USB interface.

SUMMARY

In an embodiment, an electrostatic discharge (ESD) protection device includes: a first resistor coupled between a first input terminal of the ESD protection device and a first node of the ESD protection device; a second resistor coupled between the first node and a first output terminal of the ESD protection device; and a first ESD protection component coupled between the first node and a reference voltage terminal of the ESD protection device, wherein the reference voltage terminal is configured to be coupled to a reference voltage.

In an embodiment, an electronic device includes: a universal serial bus (USB) interface and an electrostatic discharge (ESD) protection device. The USB interface includes: a USB receptacle; an alternating current (AC) coupling capacitor, wherein a first terminal of the AC coupling capacitor is coupled to a data pin of the USB receptacle; and a discharge resistor coupled between the first terminal of the AC coupling capacitor and a reference voltage node. The ESD protection device includes: a first resistor coupled between a second terminal of the AC coupling capacitor and a first node; an ESD protection component coupled between the first node and the reference voltage node; and a second resistor coupled between the first node and a first circuit of the USB interface.

In an embodiment, an electrical component includes: a first input terminal; a first output terminal; a reference voltage terminal; a first resistor coupled between the first input terminal and a first node; a second resistor coupled between the first node and the first output terminal; and a first electrostatic discharge (ESD) protection component coupled between the first node and the reference voltage terminal, wherein the first ESD protection component is configured to limit a voltage of the first node when an input voltage at the first input terminal is above a first predetermined threshold.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Throughout the discussion herein, unless otherwise specified, the same or similar numerals in different figures refer to the same or similar component.

The present disclosure will be described with respect to example embodiments in a specific context, namely ESD protection devices for USB interfaces that provide protection against ESD strikes and EOS events (e.g., short-to-Vbus events).

Figure 1:
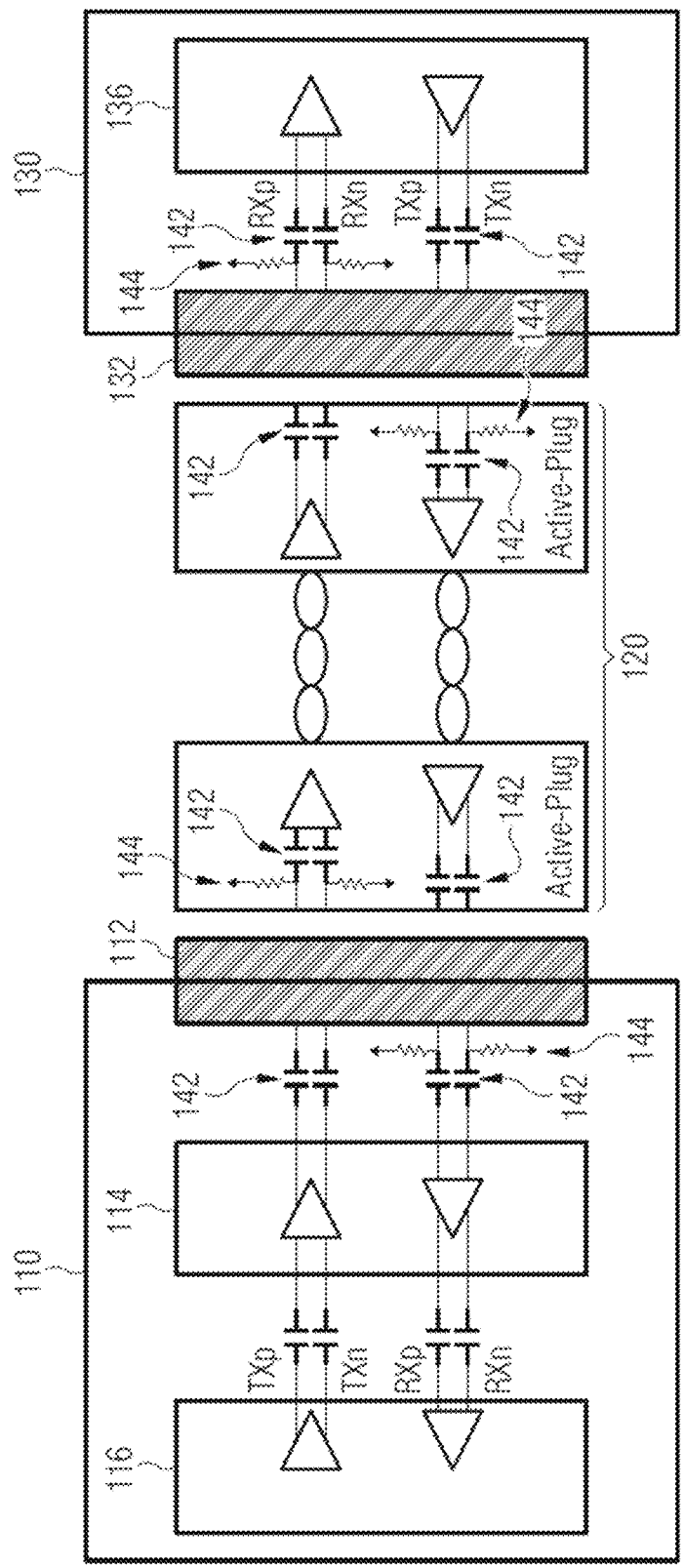
FIG. 1 illustrates electronic devices with USB interfaces that include AC coupling capacitors and discharge resistors, in an embodiment.

FIG. 1 illustrates electronic devices with USB interfaces that include AC coupling capacitors and discharge resistors, in an embodiment. In particular, FIG. 1 shows a circuit diagram schematically depicting a first electronic device no and a second electronic device 130 interconnected by their USB receptacles 112 and 132 via an active cable 120 to enable data communication between the first electronic device no and the second electronic device 130.

In the illustrated embodiment, the first electronic device no is a USB device, and the second electronic device 130 is a USB host. In an alternative embodiment, the first electronic device no is a USB host, and the second electronic device 130 is a USB device.

In the example of FIG. 1, the USB device no and the USB host 130 comprise a device router 116 and a host router 136, respectively, which can communicate with each other using a communication signal. The USB device no further includes a re-timer 114 for a compensation of distortions of the communication signal, in some embodiments.

The example of FIG. 1 particularly relates to USB 3.2 or USB4 applications which include AC coupling capacitors 142 in the transmit path according to the Universal Series Bus 4 (USB4) Specification (Version 1.0, Aug. 2019). In addition, the USB4 Specification also includes AC coupling capacitors 142 and discharge resistors 144 in the receive path.

The first electronic device no and the second electronic device 130 in FIG. 1 do not include any ESD protection devices. In the discussion hereinafter, various embodiment ESD protection devices (e.g., 245, 247, 600, 700, and Boo) are discussed, which may be implemented in the first electronic device 110 and the second electronic device 130 to provide protection against ESD events and EOS events. Details are discussed hereinafter. For ease of discussion, ESD events and EOS events may be collectively referred to as hazardous events in the discussion below. In addition, the discussion herein uses the short-to-Vbus event as an example of the EOS event, and may use the term "short-to-Vbus event" and "EOS event" interchangeably, with the understanding that EOS events are not limited to short-to-Vbus events, and that besides short-to-Vbus events, the disclosed embodiments herein may provide protection against other EOS events. Furthermore, as skilled artisans readily appreciate, the various embodiments ESD protection devices may also be used in the plugs (e.g., connectors) of an active cable, or next to the plugs of an active cable, to provide protection against hazardous events.

Figure 2:
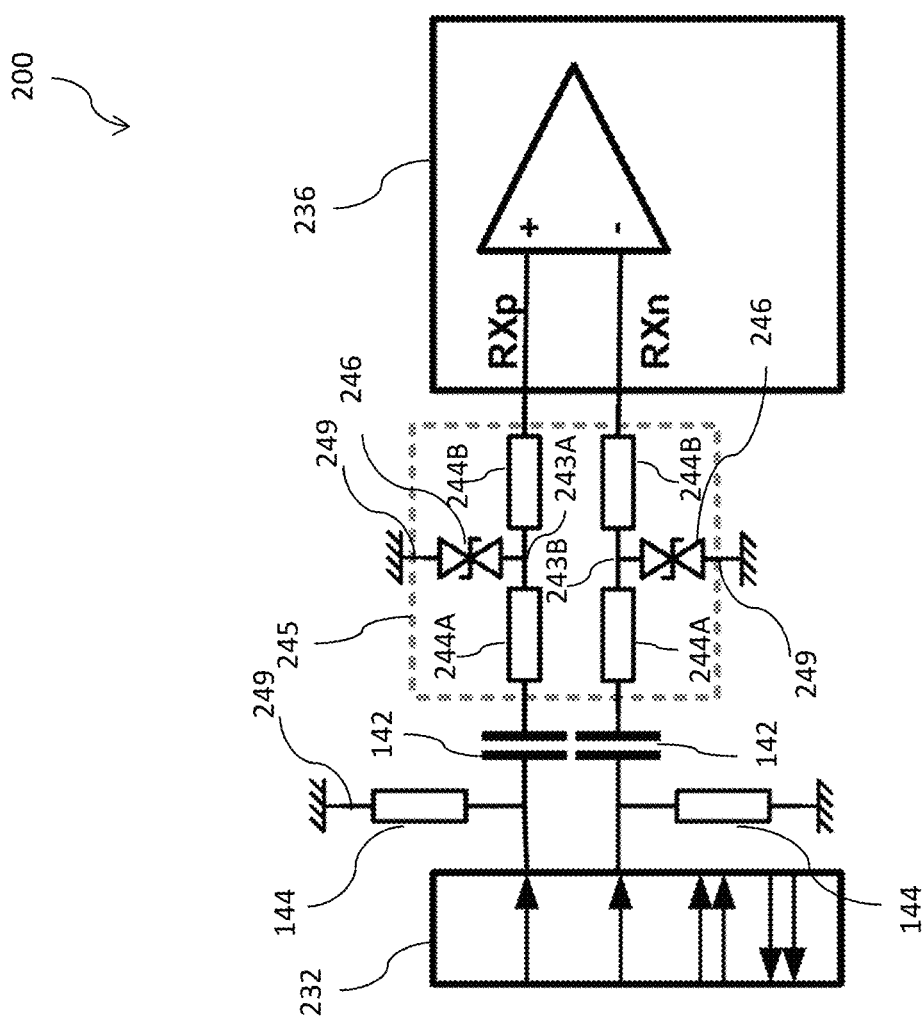
FIG. 2 illustrates an electronic device having a USB interface and an ESD protection device, in an embodiment.

FIG. 2 illustrates an electronic device 200 having a USB interface and an ESD protection device, in an embodiment. Note that for simplicity, not all features of the electronic device 200 are illustrated in FIG. 2. The electronic device 200 may be, e.g., a computer, a smartphone, a data (mass) storage device, or another electronic device. The USB interface may be, e.g., a USB hub or a USB host for USB 3.2 or USB4 applications. The USB interface in FIG. 2 includes a USB receptacle 232, AC coupling capacitors 142, discharge resistors 144, and a USB circuit 236. In an example embodiment, the USB receptacle 232 is a USB Type-C receptacle, and the USB circuit 236 is or comprises a USB router for implementing USB4 interface functionalities. In addition, FIG. 2 illustrates an ESD protection device 245 coupled between the AC coupling capacitors 142 and the USB circuit 236. The ESD protection device 245 includes first resistors 244A and second resistor 244B (which may be collectively referred to as resistors 244), and ESD protection components 246 (e.g., Zener diodes or the like). Details of the USB interface and the ESD protection device are discussed below.

As an example, the USB receptacle 232 in FIG. 2 may correspond to the USB receptacle 132 in FIG. 1, and the USB circuit 236 in FIG. 2 may correspond to the host router 136 in FIG. 1. As another example, the USB receptacle 232 may correspond to the USB receptacle 112 in FIG. 1, and the USB circuit 236 may correspond to the re-timer 114 and the device router 116 in FIG. 1. Note in the illustrated embodiment, the ESD protection device 245 is located in a receive path (e.g., for receiving data signal) of the electrical device. This is, of course, merely a non-limiting example. Skilled artisans will readily appreciate that the ESD protection device 245 may also be used in a transmit path (e.g., for transmitting data signal) of the electric device. For example, the disclosed ESD protection device 245 may also be used (e.g., coupled) in the transmit path, such as between the AC coupling capacitors 142 and the re-timer 114 of the first electronic device no in FIG. 1, or between the AC coupling capacitors 142 and the host router 136 of the second electronic device 130 in FIG. 1. In other words, each of the first electronic devices 110 and 130 in FIG. 1 may incorporate at least two ESD protection devices 245 (or other disclosed ESD protection devices in this disclosure): one in the transmit path and one in the receive path.

As illustrated in FIG. 2, a first terminal (e.g., the left terminal) of each AC coupling capacitor 142 is electrically coupled to a signal pin (e.g., a high-speed data pin) of the USB receptacle 232, and a second terminal (e.g., the right terminal) of each AC coupling capacitor 142 is electrically coupled to an input terminal of the ESD protection device 245. A discharge resistor 144 is coupled between the first terminal of the AC coupling capacitor 142 and a reference voltage node 249, which is configured to be connected to a reference voltage, such as electrical ground. For simplicity, unless other specified, the term "coupled" is used interchangeably with "electrically coupled" in the discussion herein. In the receive path of USB4 applications, an electric resistance of the discharge resistor 144 may be between 200 KΩ and 242 KΩ, and a capacitance of the AC coupling capacitor may be between 300 nF and 363 nF. In the transmit path of USB4 applications, the AC coupling capacitors 242 may have a capacitance between 135 nF and 265 nF. In some examples, the AC coupling capacitor 242 may have a capacitance between 100 nF and 500 nF. In some examples, the electric resistance of the discharge resistor 144 may be between 50 KΩ and 1 MΩ.

Note that in the example of FIG. 2, two signal pins in the USB receptacle 232 are used to receive a differential data signal (e.g., having two signal paths). The ESD protection device 245 of FIG. 2 includes two identical circuits, where each of the two identical circuits is used for ESD protection on a signal path of the differential data signal.

In FIG. 2, each of the two identical circuits of the ESD protection device 245 includes a first resistor 244A, a second resistor 244B, and an ESD protection component 246. The first resistor 244A is coupled between an input terminal (which is coupled to the AC coupling capacitor 142) of the ESD protection device 245 and a node 243 (e.g., 243A or 243B), and the second resistor 244B is coupled between the node 243 and an output terminal of the ESD protection device 245 (which is coupled to the USB circuit 236). The ESD protection component 246 is coupled between the node 243 and the reference voltage node 249, which is configured to be connected to a reference voltage, such as electrical ground.

In some embodiments, the sum of the electric resistances (also referred to as resistances) of the first resistor 244A and the second resistor 244B is between about 0.5 Ω and about 5 Ω, such as about 2 Ω. The resistances of the first resistor 244A and the second resistor 244B are chosen to be small enough to reduce energy dissipation during normal operation (e.g., during USB data transmission without a hazardous event), but not too small such that during a hazardous event (e.g., an ESD event or a short-to-Vbus event), the first resistor 244A and the second resistor 244B absorb (e.g., consume, or dissipate) enough energy from the hazardous event to prevent damage to the ESD protection component 246 and the USB circuit 236. In some embodiments where line impedance matching is not crucial for the signal integrity (e.g. applications other than USB applications, such as general purpose I/O applications), the sum of the electric resistances of the first resistor 244A and the second resistor 244B may be higher than 5 Ω, such as between 5 Ω and 100 Ω, or between 100 Ω and 1 kΩ, or between 1 KΩ and 20 KΩ.

In some embodiments, the first resistor 244A and the second resistor 244B have a same resistance (e.g., 1 Ω each). In other embodiments, the first resistor 244A and the second resistor 244B have different resistances but have a sum of, e.g., about 2 Ω. The split of the total resistance (e.g., 2 Ω) between the first resistor 244A and the second resistor 244B may impact the amount of energy dissipated by the resistors 244 (e.g., 244A, 244B), the ESD protection component 246, and other pails of the electronic device 200 (e.g., the USB circuit 236 and its downstream circuits) during a hazardous event. For a specific design of the electronic device 200, the impact of the choice for the first resistor 244A and the second resistor 244B may be studied by, e.g., simulations, and the results of the simulations may be used to determine an appropriate choice for the resistances of the first resistor 244A and the second resistor 244B. More details regarding the impact of the choice for the first resistor 244A and the second resistor 244B are discussed below with reference to FIG. 9.

Still referring to FIG. 2, the ESD protection component 246 may comprise one or more varistors, thyristors, diodes (e.g., Zener diodes, avalanche diodes, transient-voltage-suppression diodes), bipolar-junction transistors, transistors (e.g., metal-oxide-semiconductor transistors), combinations thereof, or the like. Skilled artisans will appreciate that the breakdown voltage of the ESD protection component 246 can be adjusted by its internal structure (e.g. its doping) to adapt the ESD protection component 246 for different applications. In the example of FIG. 2, the ESD protection component 246 comprises a first unidirectional ESD protection element (e.g., a Zener diode) and a second unidirectional ESD protection element (e.g., Zener diode) coupled in series in a "back-to-back" configuration, where a first forward bias direction of the first unidirectional ESD protection element is opposite to a second forward bias direction of the second unidirectional ESD protection element. One skilled in the art will readily appreciate that the "back-to-back" configuration provides bi-directional ESD protection from positive and negative over-voltages. Although FIG. 2 illustrates the first unidirectional ESD protection element as being connected in series with the second unidirectional ESD protection element, the first unidirectional ESD protection element and the second unidirectional ESD protection element may also be coupled in parallel between the node 243 and the reference voltage node 249 to provide bi-directional ESD protection (see, e.g., FIG. 6A). The number of unidirectional ESD protection elements (e.g., diodes) in the ESD protection component 246 illustrated in FIG. 2 and other figures of the present application are merely non-limiting examples. Any suitable number of unidirectional ESD protection elements (e.g., diodes) may be used in the ESD protection device 245. Furthermore, diodes are used as a non-limiting example. Besides diodes, the ESD protection component 246 may comprise any suitable device (e.g., capable of limiting voltage during an ESD event or an EOS event). These and other variations are fully intended to be included within the scope of the present disclosure.

In some embodiments, the ESD protection device 245 is an integrated circuit (IC) die. In other words, the first resistors 244A, the second resistors 244B, and the ESD protection components 246 are integrated (e.g., formed) in a single IC die, e.g., on a single substrate using semiconductor manufacturing processes. The single IC die can be placed on, e.g., a printed circuit board (PCB) carrying the USB router IC (e.g., 236), the AC coupling capacitors 142, and the discharge resistor 144. In some embodiments, the ESD protection device 245 is configured as a bare die assembly or a packaged device, which packaged device may comprise one or multiple dies or substrates. Thus, the resistors 244A/244B and the ESD protection components 246 can be arranged on a same die/substrate, or on separate dies/substrates of the packaged device. Examples of a packaged device include small outline package (SOP), flat package, and a surface-mounted device (SMD). In some embodiment, at least one of the components (e.g., 244A, 244B, or 246) of the ESD protection device 245 is formed as a discrete component, and the rest of the components of the ESD protection device 245 are integrated, e.g., in one or more IC dies. For example, one of the resistors (e.g., 244A or 244B) may be formed as a discrete component (e.g., a discrete resistor), and the other resistors and the ESD protection components 246 are integrated in one or more IC dies. In some embodiments, the AC coupling capacitors 142 are integrated into the ESD protection device 245. In some embodiments, the AC coupling capacitors 142 and the discharge resistors 144 are integrated into the ESD protection device 245. In some embodiments, the components (e.g., 244A, 244B, or 246) of the ESD protection device 245 are not integrated in an IC die. For example, the components (e.g., 244A, 244B, or 246) of the ESD protection device 245 may be discrete components. These and other variations are fully intended to be included within the scope of the present disclosure.

Compared with a solution where discrete components are used to form the ESD protection device, the ESD protection devices (e.g., 245, 247, 600, 700, and 800) disclosed herein, by integrating the various components (e.g., 244A, 244B, 246) of the ESD protection device in a single semiconductor die or in a single packaged device, greatly reduces the cost and the space required for the ESD protection device.

During normal operation, when data are transmitted through the USB interface and when there is no ESD event and no EOS event, the voltages at the nodes 243 (e.g., 243A or 243B) are below the breakdown voltages of the ESD protection components 246. Therefore, except for a negligible leakage current, no current flows through the ESD protection components 246, and the ESD protection device 245 equivalently functions as two small resistors (e.g., about 2 Ω), one in each of the two differential signal paths. When a hazardous event happens, the voltages at the nodes 243 are above the breakdown voltages of the ESD protection components 246, the ESD protection components 246 clamp (e.g., limit) the voltages at the nodes 243 at or around the breakdown voltages. During the hazardous event (e.g., the ESD event or the short-to-Vbus event), the electric current in the signal path that is subjected to the hazardous event flows through the first resistor 244A, then splits and flows through both the ESD protection component 246 and the second resistor 244B. Since a portion of the energy release during the hazardous event (may also be referred to as ESD energy or EOS energy) is absorbed (e.g., consumed, or dissipated) by the first resistor 244A, the ESD protection component 246 dissipates less ESD energy. This reduces the stress on the ESD protection component 246, and therefore, reduces the likelihood of the ESD protection component 246 being damaged during the hazardous event. In addition, residual portions of the ESD energy is absorbed by the second resistor 244B before going into the USB circuit 236. This reduces the stress to the USB circuit 236 and its downstream circuits. As a result, damage to the USB circuit 236 and its downstream circuits may be avoided.

Note that in the illustrated embodiments, the location of the ESD protection device 245 is downstream of the AC coupling capacitors 142 (e.g., between the AC coupling capacitors 142 and the USB circuit 236), this is more advantageous than an upstream location (e.g., between the USB receptacle 232 and the discharge resistors 144), because during an EOS event (e.g., a short-to-Vbus event), a DC path between the line carrying a DC voltage (e.g. the Vbus line) and the ESD protection device 245 may lead to a high energy dissipation in the ESD protection device 245, which may damage the ESD protection components 246 easily if the breakdown voltage or trigger voltage of the ESD protection components 246 is below the DC voltage related to the EOS event.

To appreciate the advantages of the design of disclosed ESD protection device 245 (or other disclosed ESD protection devices), consider the following reference designs which are obtained by modifying the ESD protection device 245. First, consider a first reference design where the ESD protection device does not have the first resistors 244A and the second resistors 244B, and only has the ESD protection components 246. The first reference design limits the duration of the stress on the ESD protection component 246 to the time needed to charge the AC coupling capacitors 142. However, the ESD energy from the hazardous event that has to be dissipated by the ESD protection components 246 can still be considerable, and may damage the ESD protection component 246. In addition, the residual stress (e.g., remaining ESD energy) goes directly into the USB circuit 236 and may damage the USB circuit 236 and/or its downstream circuits.

Next, consider a second reference design where the second resistors 244B in the ESD protection device 245 of FIG. 2 are removed, and each of the first resistors 244A is assigned a higher resistance value, which is equal to the sum of the resistances (e.g., 2 Ω) of the first resistor 244A and the second resistor 244B in each signal path of FIG. 2. The second reference design may reduce the stress on the ESD protection components 246, but the residual stress (e.g., remaining ESD energy) goes directly into the USB circuit 236 and may damage the USB circuit 236 and/or its downstream circuits.

Furthermore, consider a third reference design where the first resistors 244A in the ESD protection device 245 of FIG. 2 are removed, and each of the second resistors 244B is assigned a higher resistance value, which is equal to the sum of the resistances (e.g., 2 Ω) of the first resistor 244A and the second resistor 244B in each signal path of FIG. 2. The third reference design may reduce the stress on the USB circuit 236, but the ESD protection components 246 may experience significant stress due to the amount of ESD energy being dissipated by the ESD protection components 246.

Simulations have been performed to study the stress experienced (e.g., ESD energy dissipated) by different components (e.g., 244A, 244B, 246) of the ESD protection device and by the downstream circuits (e.g., 236) of the electronic device in a short-to-Vbus event. The simulation results are shown in FIG. 9.

Figure 9:
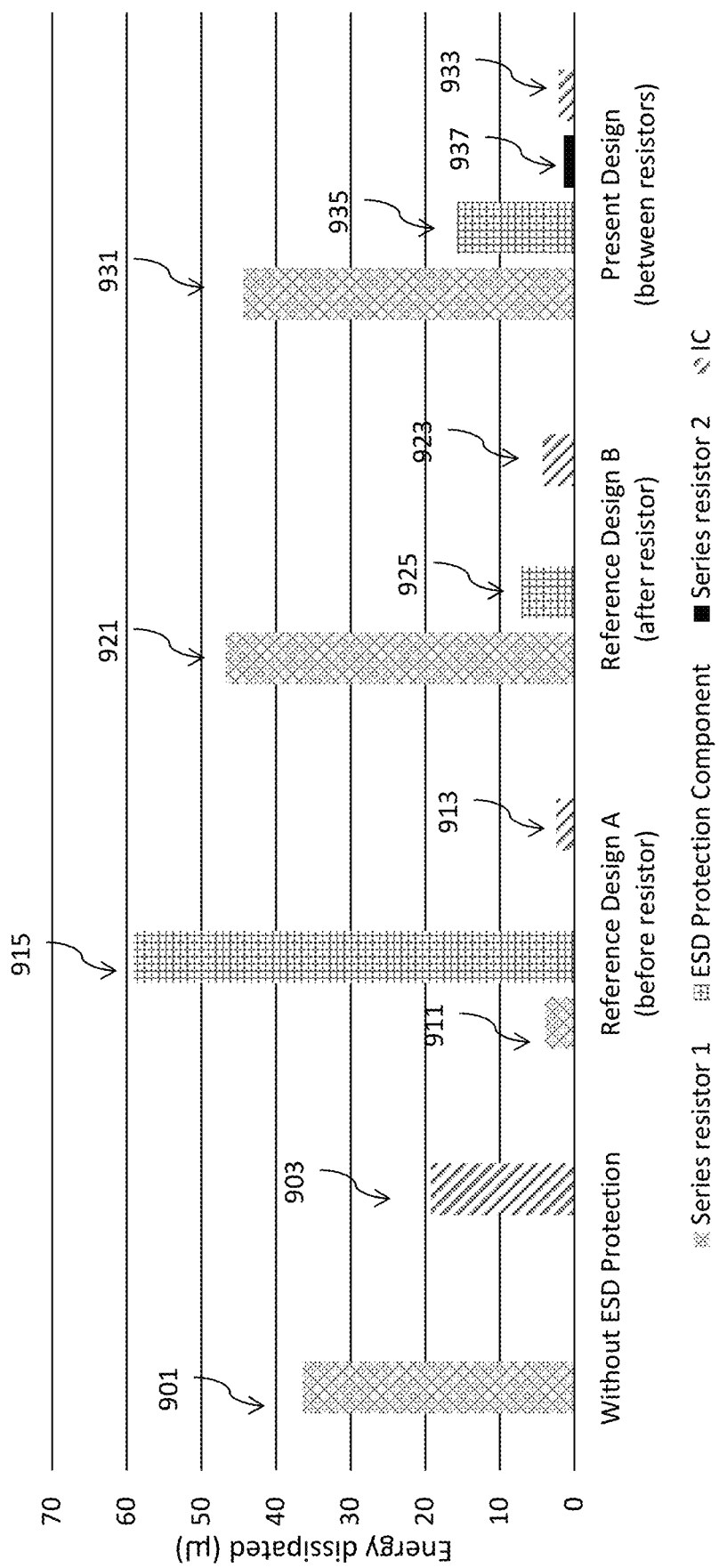
FIG. 9 illustrates an example performance comparison between a disclosed ESD protection device and reference designs without the disclosed ESD protection device.

Referring temporarily to FIG. 9, four sets of simulation data are shown in a bar graph. The bars 911, 915, and 913 show the energy dissipated by the resistor 244 (e.g., 244B), the ESD protection component 246, and the USB circuit 236, respectively, for the third reference design discussed above. The bars 921, 925, and 923 show the energy dissipated by the resistor 244 (e.g., 244A), the ESD protection component 246, and the USB circuit 236, respectively, for the second reference design discussed above. The bars 931, 935, 937, and 933 show the energy dissipated by the first resistor 244A, the ESD protection component 246, the second resistor 244B, and the USB circuit 236, respectively, for the ESD protection device 245 of FIG. 2. For comparison, FIG. 9 further shows the energy dissipation for a fourth reference design where the ESD protection components 246 are removed from the ESD protection device 245, which effectively reduces the ESD protection device into resistors. The bars 901 and 903 shows the energy dissipated by the resistor and the USB circuit 236, respectively, of the fourth reference design.

From FIG. 9, it is seen that due to the lack of the ESD protection component 246, the fourth reference design is not effective in protecting the electronic device, and a significant amount of energy is dissipated by the USB circuit 236, as indicated by the bar 903. For the third reference design, since the ESD protection component 246 is upstream of the second resistor 244B, the ESD protection component 246 experiences significant amount of stress, as indicated by the bar 915. For the second reference design, the first resistor 244A dissipates most of the energy (see bar 921), but the stress on the USB circuit 236 is the highest among all the designs having ESD protection components 246 (see bar 923). The current disclosed ESD protection device 245, by having resistors 244 (e.g., 244A and 244B) on both sides of the ESD protection component 246, achieves a balance between the stress on the ESD protection component 246 (see bar 935) and the stress on the USB circuit 236 (see bar 933). As discussed earlier, by changing the ratio between the resistances of the first resistor 244A and the second resistor 244B, the stress on the ESD protection component 246 and the stress on the USB circuit 236 may be adjusted. For a particular device design, depending on different performance criteria, a designer may find the optimal ratio between the resistances of the first resistor 244A and the second resistor 244B to achieve the performance target through, e.g., analysis or simulations.

Figure 3:
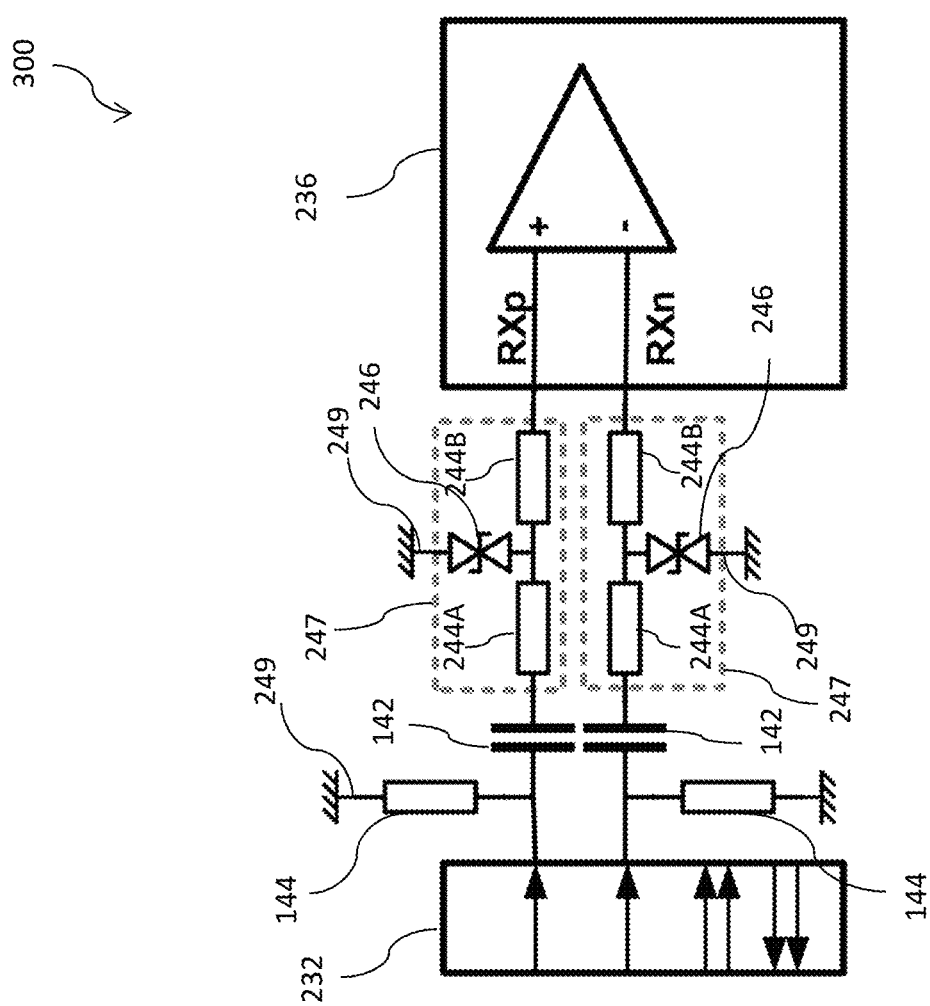
FIG. 3 illustrates an electronic device having a USB interface and an ESD protection device, in another embodiment.

Referring now to FIG. 3, which illustrates an electronic device 300 having a USB interface and an ESD protection device, in an embodiment. The electronic device 300 is similar to the electronic device 200 of FIG. 2, but has two ESD protection devices 247. In particular, the first resistor 244A, the second resistor 244B, and the ESD protection components 246 for each signal path of the differential signal are integrated into an IC die. In other words, the two identical circuits in the ESD protection device 245 of FIG. 2 are separately integrated into two ESD protection devices 247 of FIG. 3. The ESD protection device 247 in FIG. 3 allows more flexibility for integration into electronic devices for different signal configurations. For example, if ESD protection is used for a single-ended signal path, an ESD protection device 247 may be used.

Figure 4:
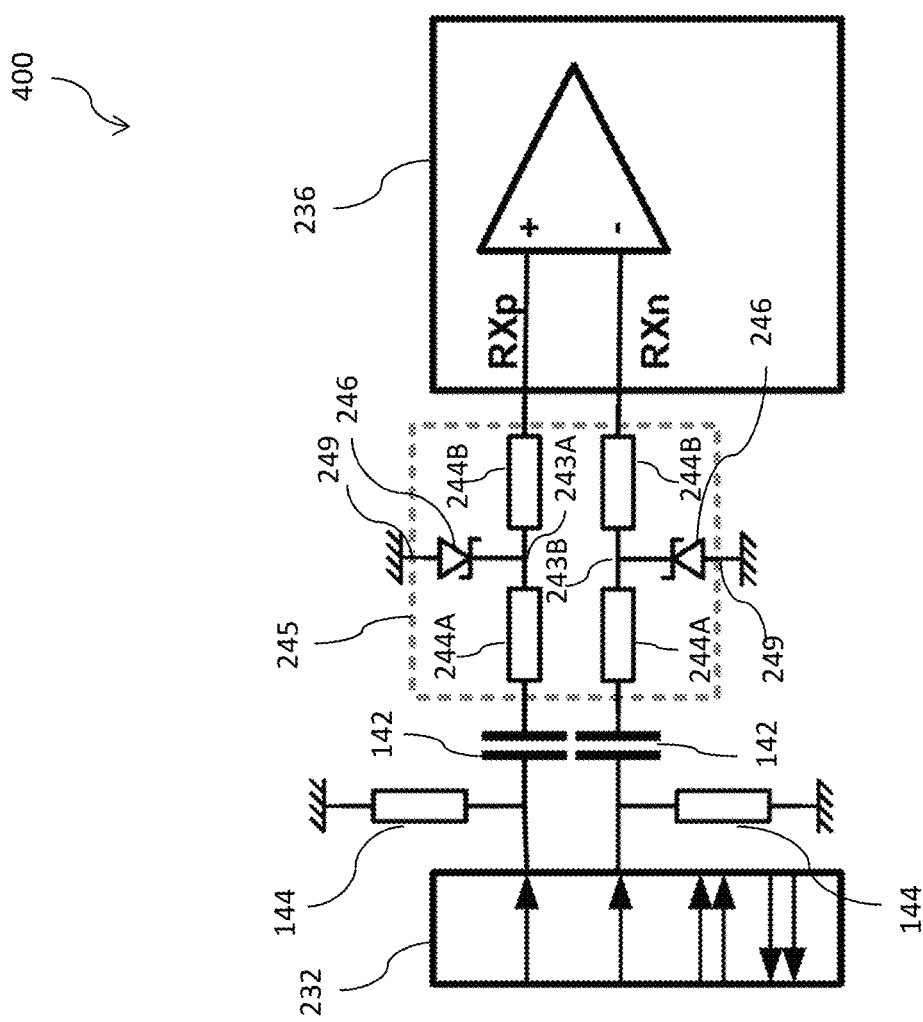
FIG. 4 illustrates an electronic device having a USB interface and an ESD protection device, in another embodiment.

FIG. 4 illustrates an electronic device 400 having a USB interface and an ESD protection device, in an embodiment. The electronic device 400 is similar to the electronic device 200 of FIG. 2, but the ESD protection component 246 of the ESD protection device 245 in FIG. 4 does not have the back-to-back connected unidirectional ESD protection elements (e.g., Zener diodes). Instead, a single Zener diode is used in the ESD protection component 246 of FIG. 4. In other embodiments, the ESD protection component 246 of FIG. 4 includes a plurality of Zener diodes connected in series, with the forward bias directions of the plurality of Zener diodes aligned along a same direction.

Figure 5:
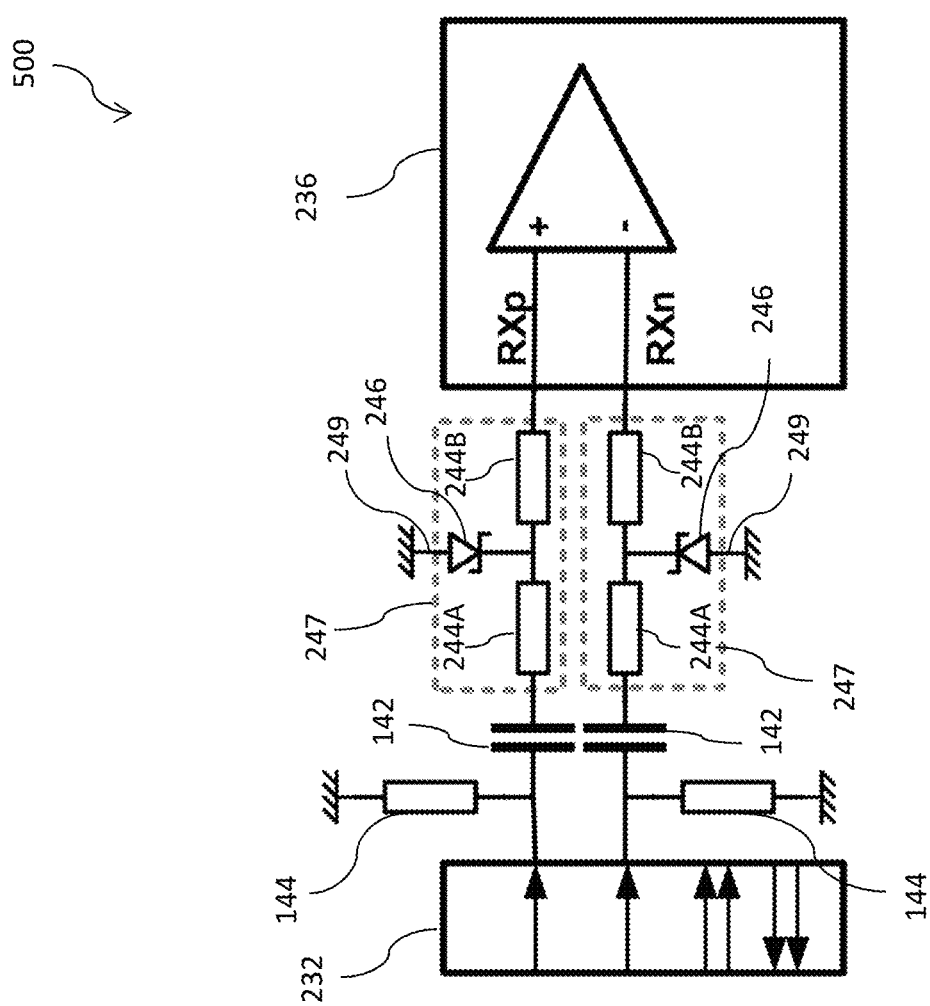
FIG. 5 illustrates an electronic device having a USB interface and an ESD protection device, in yet another embodiment.

FIG. 5 illustrates an electronic device 500 having a USB interface and an ESD protection device, in an embodiment. The electronic device 500 is similar to the electronic device 300 of FIG. 3, but the ESD protection component 246 of the ESD protection device 247 in FIG. 5 does not have the back-to-back connected unidirectional ESD protection elements (e.g., Zener diodes). Instead, a single Zener diode is used in the ESD protection component 246 of FIG. 5. In other embodiments, the ESD protection component 246 of FIG. 5 includes a plurality of Zener diodes connected in series, with the forward bias directions of the plurality of Zener diodes aligned along a same direction.

Figure 6B:
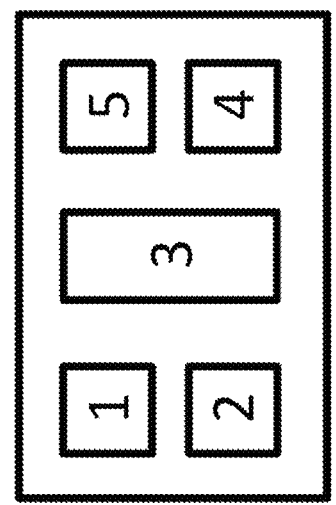
FIG. 6B illustrates a bottom view of the ESD protection device of FIG. 6A, in an embodiment.
Figure 6A:
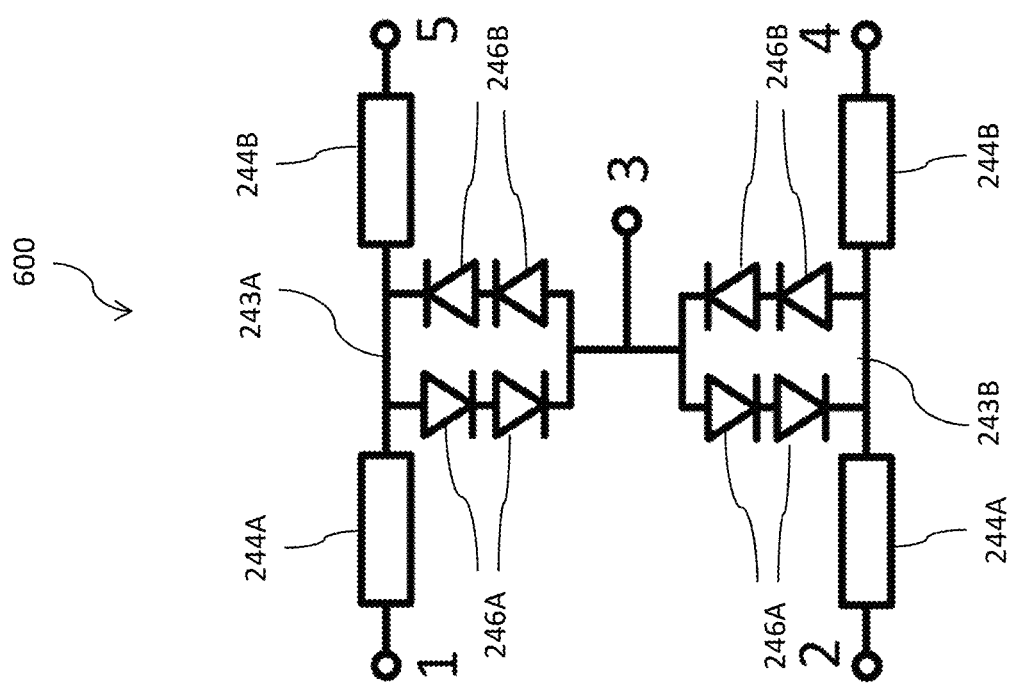
FIG. 6A illustrates a schematic view of an ESD protection device, in an embodiment.

FIG. 6A illustrates a schematic diagram of an ESD protection device 600, in an embodiment. The ESD protection device 600 may be used to replace, e.g., the ESD protection device 245 of FIG. 2. As illustrated in FIG. 6A, the ESD protection device 600 has five terminals labeled from 1 to 5. The terminal 3 is configured to be connected to a reference voltage, such as electrical ground. Two of the terminals, such as terminal 1 and terminal 2, may be used as input terminals and coupled to, e.g., the AC coupling capacitors 142 in FIG. 2, while the other two terminals, such as terminal 5 and terminal 4, may be used as output terminals and coupled to, e.g., the USB circuit 236 in FIG. 2. The first resistors 244A and 244B are the same as or similar to those in FIG. 2, thus details are not repeated.

In the example of FIG. 6A, each ESD protection component 246 includes first diodes 246A (e.g., pn-junction diodes, pin-junction diodes, MOS-diodes, gated-diodes, or the like) connected in series and second diodes 246B (e.g., pn-junction diodes, pin-junction diodes, MOS-diodes, gated-diodes, or the like) connected in series, where the forward bias directions of the first diodes 246A are aligned along a first direction, and the forward bias directions of the second diodes 246B are aligned along a second direction opposite to the first direction. Note that while FIG. 2 illustrates unidirectional ESD protections elements (e.g., Zener diodes) connected in series, the first diodes 246A and the second diodes 246B of the ESD protection component 246 in FIG. 6A are coupled in parallel between the node 243A (or 243B) and the terminal 3.

Figure 6C:
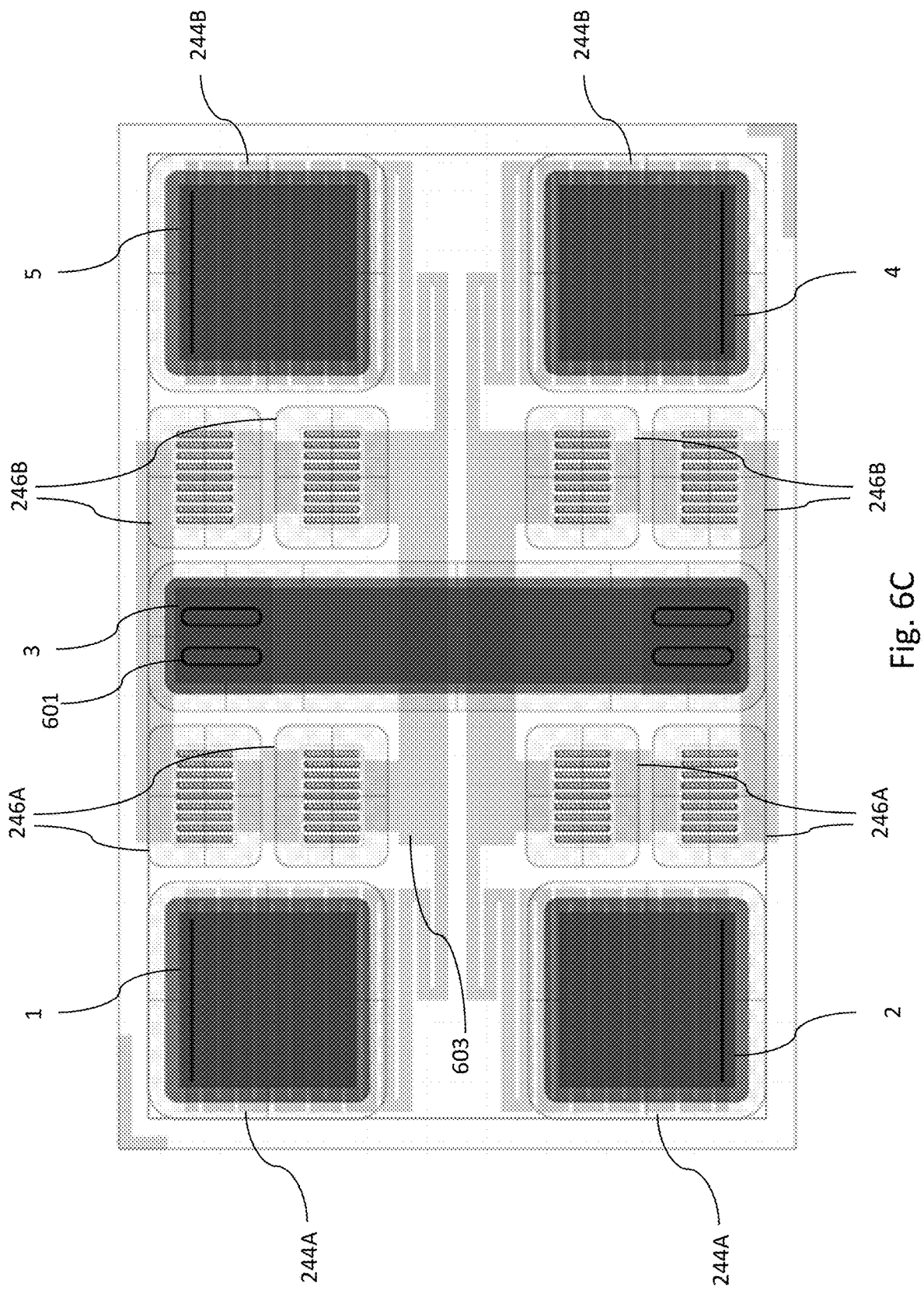
FIG. 6C illustrates a layout design for the ESD protection device of FIG. 6A, in an embodiment.

FIG. 6B illustrates a bottom view of the ESD protection device 600 of FIG. 6A, in an embodiment. In the example of FIGS. 6A-6C, the ESD protection device 600 is an integrated circuit (IC), and FIG. 6B shows the active side of the IC, which active side has conductive pads (e.g., copper pads) of the IC. The conductive pads 1-5 in FIG. 6B correspond to the terminals 1-5 of FIG. 6A, respectively, and allow electrical connection to the internal circuits of the IC.

FIG. 6C illustrates a layout design for the ESD protection device 600 of FIG. 6A, in an embodiment. Note that in FIG. 6C, various features that are formed in different layers of the IC are shown in a plan view. For example, the conductive pads 1-5 are formed directly over the resistors 244 (e.g., 244A and 244B), and the resistors 244 are formed as zig-zag shaped (also referred to as meandering) conductive lines embedded between dielectric layers directly under the conductive pads 1-5. The ESD protection components 246 (e.g., 246A and 246B) may be formed in a semiconductor substrate below the dielectric layers that enclose the resistors 244 in some embodiments. Conductive lines 603 interconnect the resistors 244, the ESD protection components 246, and the conductive pads 1-5 in accordance with FIG. 6A. FIG. 6C further illustrates vias 601, which connect the conductive pad 3 with underlying conductive lines. Although not shown, vias may also be formed to electrically couple the ESD protection components 246 with other conductive features of the ESD protection device 600.

Figure 7B:
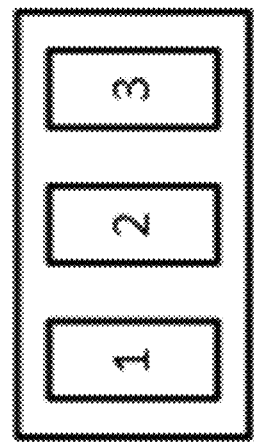
FIGS. 7A and 7B illustrate a schematic view and a bottom view, respectively, of an ESD protection device, in an embodiment.
Figure 7A:
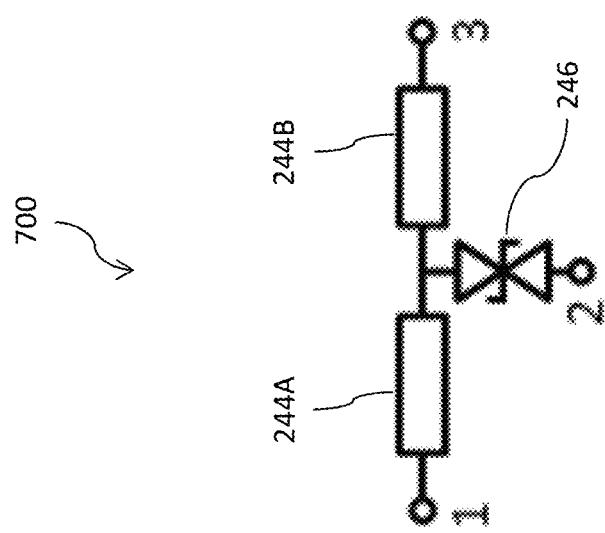

FIGS. 7A and 7B illustrate a schematic view and a bottom view, respectively, of an ESD protection device 700, in an embodiment. The ESD protection device 700 is an integrated circuit (IC) and corresponds to, e.g., the ESD protection device 247 in FIG. 3. Details are not repeated.

Figure 8B:
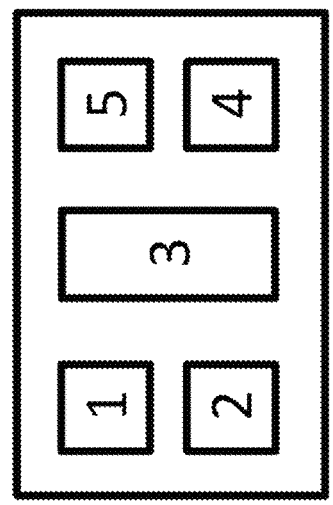
FIGS. 8A and 8B illustrate a schematic view and a bottom view, respectively, of an ESD protection device, in another embodiment.
Figure 8A:
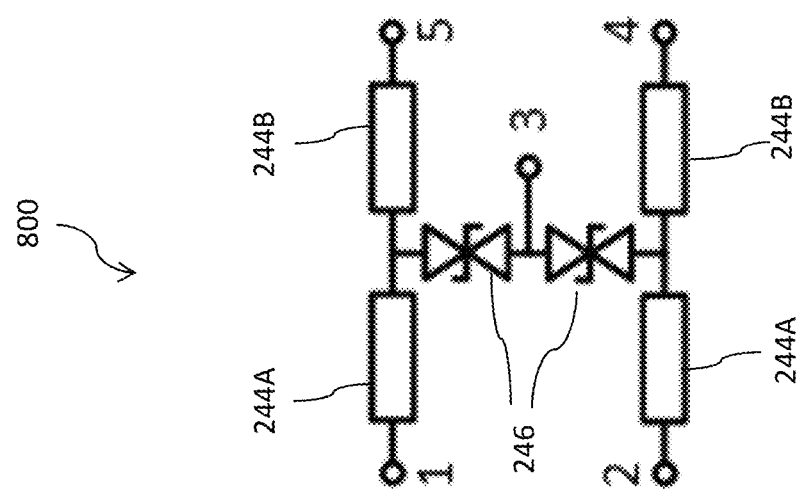

FIGS. 8A and 8B illustrate a schematic view and a bottom view, respectively, of an ESD protection device 800, in another embodiment. The ESD protection device 800 is an integrated circuit (IC) and corresponds to, e.g., the ESD protection device 245 in FIG. 2. Details are not repeated.

Variations to the disclosed embodiments are possible and are fully intended to be included within the scope of the present disclosure. For example, while the disclosed ESD protection devices (e.g., 245, 247, 600, 700, and 800) are designed to provide protection against hazardous events (e.g., ESD events or short-to-Vbus events) for a single data line or a pair of data lines, skilled artisans will readily appreciate that the disclosed ESD protection structure can be easily replicated in the integrated circuit to provide ESD protection for three, four, or more data lines. In other words, an IC die may include enough copies of the ESD protection circuits for three, four, or more data lines. As another example, while diodes are used as examples in the illustrated embodiments as the ESD protection components 246, any suitable components capable of providing over-voltage protection may be used as the ESD protection components.

Embodiments may achieve advantages. For example, the disclosed ESD protection device, by placing a resistor 244 (e.g., 244A or 244B) on each side of the ESD protection component 246, relieves stress on the ESD protection components 246 and the USB circuit 236 (and its downstream circuits). The resistances of the resistors 244 are chosen to be small enough to reduce power consumption during normal operation and to ensure low impact on the signal quality (e.g., due to impedance disturbance in the signal line caused by the resistors 244), and large enough to dissipate a significant portion of the ESD or EOS energy during a hazardous event (e.g., an ESD event or a short-to-Vbus event). By adjusting the ratio between the resistances of the first resistor 244A and the second resistor 244B, the amount of energy dissipated by each component of the ESD protection device and the IC to be protected, such as the USB circuit 236, can be fine-tuned to achieve different performance targets.

Example embodiments of the present invention are summarized here. Other embodiments can also be understood from the entirety of the specification and the claims filed herein.

Example 1. In an embodiment, an electrostatic discharge (ESD) protection device includes: a first resistor coupled between a first input terminal of the ESD protection device and a first node of the ESD protection device; a second resistor coupled between the first node and a first output terminal of the ESD protection device; and a first ESD protection component coupled between the first node and a reference voltage terminal of the ESD protection device, wherein the reference voltage terminal is configured to be coupled to a reference voltage.

Example 2. The ESD protection device of Example 1, wherein the reference voltage is electrical ground.

Example 3. The ESD protection device of Example 1, wherein a sum of a first resistance of the first resistor and a second resistance of the second resistor is between about 0.5 Ω and about 5 Ω.

Example 4. The ESD protection device of Example 1, wherein the first ESD protection component comprises a varistor, a thyristor, a diode, a transistor, or combinations thereof.

Example 5. The ESD protection device of Example 1, wherein the first resistor, the second resistor, and the first ESD protection component are integrated in one or more semiconductor dies.

Example 6. The ESD protection device of Example 1, wherein a first one of the first resistor, the second resistor, and the first ESD protection component is integrated in a semiconductor die, and a second one of the first resistor, the second resistor, and the first ESD protection component is a discrete component outside the semiconductor die.

Example 7. The ESD protection device of Example 1, further comprising: a third resistor coupled between a second input terminal of the ESD protection device and a second node of the ESD protection device; a fourth resistor coupled between the second node and a second output terminal of the ESD protection device; and a second ESD protection component coupled between the second node and the reference voltage terminal of the ESD protection device.

Example 8. In an embodiment, an electronic device includes: a universal serial bus (USB) interface and an electrostatic discharge (ESD) protection device. The USB interface includes: a USB receptacle; an alternating current (AC) coupling capacitor, wherein a first terminal of the AC coupling capacitor is coupled to a data pin of the USB receptacle; and a discharge resistor coupled between the first terminal of the AC coupling capacitor and a reference voltage node. The ESD protection device includes: a first resistor coupled between a second terminal of the AC coupling capacitor and a first node; an ESD protection component coupled between the first node and the reference voltage node; and a second resistor coupled between the first node and a first circuit of the USB interface.

Example 9. The electronic device of Example 8, wherein the first resistor, the second resistor, and the ESD protection component are integrated in one or more semiconductor dies.

Example 10. The electronic device of Example 8, wherein the ESD protection component comprises a first unidirectional ESD protection element and a second unidirectional ESD protection element.

Example 11. The electronic device of Example 10, wherein the first unidirectional ESD protection element and the second unidirectional ESD protection element are coupled in series between the first node and the reference voltage node, wherein a first forward bias direction of the first unidirectional ESD protection element is opposite to a second forward bias direction of the second unidirectional ESD protection element.

Example 12. The electronic device of Example 10, wherein the first unidirectional ESD protection element and the second unidirectional ESD protection element are coupled in parallel between the first node and the reference voltage node, wherein a first forward bias direction of the first unidirectional ESD protection element is opposite to a second forward bias direction of the second unidirectional ESD protection element.

Example 13. The electronic device of Example 8, wherein a capacitance of the AC coupling capacitor is between about 100 nF and about 500 nF, and wherein an electric resistance of the discharge resistor is between about 50 kΩ and about 1 MΩ.

Example 14. The electronic device of Example 13, wherein the first resistor has a first electric resistance, and the second resistor has a second electric resistance, wherein a sum of the first electric resistance and the second electric resistance is between about 0.5 Ω and about 5 Ω.

Example 15. The electronic device of Example 14, wherein the first electrical resistance is a same as the second electrical resistance.

Example 16. The electronic device of Example 8, wherein the ESD protection component comprises a varistor, a thyristor, a diode, a transistor, or combinations thereof.

Example 17. The electronic device of Example 8, wherein the USB receptacle is a USB Type-C receptacle.

Example 18. The electronic device of Example 8, wherein the first circuit is a circuit for implementing a differential serial data transfer function.

Example 19. In an embodiment, an electrical component includes: a first input terminal; a first output terminal; a reference voltage terminal; a first resistor coupled between the first input terminal and a first node; a second resistor coupled between the first node and the first output terminal; and a first electrostatic discharge (ESD) protection component coupled between the first node and the reference voltage terminal, wherein the first ESD protection component is configured to limit a voltage of the first node when an input voltage at the first input terminal is above a first pre-determined threshold.

Example 20. The electrical component of Example 19, further comprising: a second input terminal; a second output terminal; a third resistor coupled between the second input terminal and a second node; a fourth resistor coupled between the second node and the second output terminal; and a second ESD protection component coupled between the second node and the reference voltage terminal, wherein the second ESD protection component is configured to limit a voltage of the second node when an input voltage at the second input terminal is above a second pre-determined threshold.

Example 21. The electrical component of Example 19, wherein the first ESD protection component comprises a varistor, a thyristor, a diode, a transistor, or combinations thereof.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electrostatic discharge (ESD) protection device comprising:
 a first resistor coupled between a first input terminal of the ESD protection device and a first node of the ESD protection device;
 a second resistor coupled between the first node and a first output terminal of the ESD protection device; and a first ESD protection component coupled between the first node and a reference voltage terminal of the ESD protection device, wherein the reference voltage terminal is configured to be coupled to a reference voltage, wherein a first one of the first resistor, the second resistor, and the first ESD protection component is integrated in a semiconductor die, and a second one of the first resistor, the second resistor, and the first ESD protection component is a discrete component outside the semiconductor die.

2. The ESD protection device of claim 1, wherein the reference voltage is electrical ground.

3. The ESD protection device of claim 1, wherein a sum of a first resistance of the first resistor and a second resistance of the second resistor is between about 0.5 Ω and about 5 Ω.

4. The ESD protection device of claim 1, wherein the first ESD protection component comprises a varistor, a thyristor, a diode, a transistor, or combinations thereof.

5. The ESD protection device of claim 1, further comprising:
a third resistor coupled between a second input terminal of the ESD protection device and a second node of the ESD protection device;
a fourth resistor coupled between the second node and a second output terminal of the ESD protection device; and
a second ESD protection component coupled between the second node and the reference voltage terminal of the ESD protection device.

6. An electronic device comprising:
a universal serial bus (USB) interface comprising:
a USB receptacle;
an alternating current (AC) coupling capacitor, wherein a first terminal of the AC coupling capacitor is coupled to a data pin of the USB receptacle; and
a discharge resistor coupled between the first terminal of the AC coupling capacitor and a reference voltage node; and
an electrostatic discharge (ESD) protection device comprising:
a first resistor coupled between a second terminal of the AC coupling capacitor and a first node;
an ESD protection component coupled between the first node and the reference voltage node; and
a second resistor coupled between the first node and a first circuit of the USB interface.

7. The electronic device of claim 6, wherein the first resistor, the second resistor, and the ESD protection component are integrated in one or more semiconductor dies.

8. The electronic device of claim 6, wherein the ESD protection component comprises a first unidirectional ESD protection element and a second unidirectional ESD protection element.

9. The electronic device of claim 8, wherein the first unidirectional ESD protection element and the second unidirectional ESD protection element are coupled in series between the first node and the reference voltage node, wherein a first forward bias direction of the first unidirectional ESD protection element is opposite to a second forward bias direction of the second unidirectional ESD protection element.

10. The electronic device of claim 8, wherein the first unidirectional ESD protection element and the second unidirectional ESD protection element are coupled in parallel between the first node and the reference voltage node, wherein a first forward bias direction of the first unidirectional ESD protection element is opposite to a second forward bias direction of the second unidirectional ESD protection element.

11. The electronic device of claim 6, wherein a capacitance of the AC coupling capacitor is between about 100 nF and about 500 nF, and wherein an electric resistance of the discharge resistor is between about 50 kΩ and about 1 MΩ.

12. The electronic device of claim 11, wherein the first resistor has a first electric resistance, and the second resistor has a second electric resistance, wherein a sum of the first electric resistance and the second electric resistance is between about 0.5 Ω and about 5 Ω.

13. The electronic device of claim 12, wherein the first electrical resistance is a same as the second electrical resistance.

14. The electronic device of claim 6, wherein the ESD protection component comprises a varistor, a thyristor, a diode, a transistor, or combinations thereof.

15. The electronic device of claim 6, wherein the USB receptacle is a USB Type-C receptacle.

16. The electronic device of claim 6, wherein the first circuit is a circuit for implementing a differential serial data transfer function.

17. An electronic device comprising:
a data interface comprising:
a receptacle;
an alternating current (AC) coupling capacitor, wherein a first terminal of the AC coupling capacitor is coupled to a data pin of the receptacle;
a discharge resistor coupled between the first terminal of the AC coupling capacitor and a reference voltage node; and
a first circuit; and
an electrostatic discharge (ESD) protection device coupled between the AC coupling capacitor and the first circuit, the EDS protection device comprising:
a first input terminal coupled to a second terminal of the AC coupling capacitor;
a first output terminal;
a reference voltage terminal coupled to the reference voltage node;
a first resistor coupled between the first input terminal and a first node;
a second resistor coupled between the first node and the first output terminal; and
a first electrostatic discharge (ESD) protection component coupled between the first node and the reference voltage terminal, wherein the first ESD protection component is configured to limit a voltage of the first node when an input voltage at the first input terminal is above a first pre-determined threshold.

18. The electronic device of claim 17, wherein the ESD protection device further comprises:
a second input terminal;
a second output terminal;
a third resistor coupled between the second input terminal and a second node;
a fourth resistor coupled between the second node and the second output terminal; and
a second ESD protection component coupled between the second node and the reference voltage terminal, wherein the second ESD protection component is configured to limit a voltage of the second node when an input voltage at the second input terminal is above a second pre-determined threshold.

19. The electronic device of claim 17, wherein the first ESD protection component comprises a varistor, a thyristor, a diode, a transistor, or combinations thereof.

20. The electronic device of claim 17, wherein the data interface is a universal serial bus (USB) interface, and the receptacle is an USB receptacle.

21. The electronic device of claim 17, wherein the first ESD protection component comprises a first unidirectional ESD protection element and a second unidirectional ESD protection element, wherein the first unidirectional ESD protection element and the second unidirectional ESD protection element are coupled in series or in parallel between the first node and the reference voltage terminal, wherein a first forward bias direction of the first unidirectional ESD protection element is opposite to a second forward bias direction of the second unidirectional ESD protection element.

* * * * *